US006242997B1

(12) United States Patent
Barrett et al.

(10) Patent No.: US 6,242,997 B1

(45) **Date of Patent: *Jun. 5, 2001**

(54) CONDUCTIVE POLYMER DEVICE AND METHOD OF MANUFACTURING SAME

(75) Inventors: Andrew Brian Barrett, Douglas (IE); Steven D. Hogge, Santa Cruz, CA (US); Wen Been Li, Taipei; Kun Ming Yang, Chung Li, both of (TW)

(73) Assignee: Bourns, Inc., Riverside, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/215,404

(22) Filed: Dec. 18, 1998

Related U.S. Application Data

(63) Continuation-in-part of application No. 09/035,196, filed on Mar. 5, 1998, now Pat. No. 6,172,591.

(51) Int. Cl.[7] .................................................... H01L 1/148

(52) U.S. Cl. ....................... 338/22 R; 338/254; 338/328; 338/332

(58) Field of Search ................................ 338/22 R, 254, 338/328, 332

(56) References Cited

U.S. PATENT DOCUMENTS

| | | | |
|---|---|---|---|
| H415 | 1/1988 | Newnham et al. | 338/22 R |
| 2,862,263 | 11/1958 | Asakawa | 201/72 |

(List continued on next page.)

FOREIGN PATENT DOCUMENTS

| | | | |
|---|---|---|---|
| 2838508 | 3/1980 | (DE) . | |
| 0158410 | 7/1984 | (EP) . | |
| 1167551 | 10/1969 | (GB) . | |
| 62-240526 | 10/1987 | (JP) . | |
| 1066903 | 3/1989 | (JP) | H01C/7/02 |
| WO97/06660 | 2/1997 | (WO) . | |
| 9812715 | 3/1998 | (WO) | H01C/9/02 |

OTHER PUBLICATIONS

Arrowsmith, D.J. (1970) "Adhesion of Electroformed Copper and Nickel to Plastic Laminates," *Transactions of the Institute of Metal Finishing,* vol. 48, pp. 88–92.

*Primary Examiner*—Karl D. Easthom
(74) *Attorney, Agent, or Firm*—Klein & Szekeres, LLP

(57) ABSTRACT

An electronic device has three conductive polymer layers sandwiched between two external electrodes and two internal electrodes. The electrodes are staggered to create a first set of electrodes, in contact with a first terminal, alternating with a second set of electrodes in contact with a second terminal. The device is manufactured by: (1) providing (a) a first laminated substructure comprising a first polymer layer between first and second metal layers, (b) a second polymer layer, and (c) a second laminated substructure comprising a third polymer layer between third and fourth metal layers; (2) isolating selected areas of the second and third metal layers to form, respectively, first and second arrays of internal metal strips; (3) laminating the first and second laminated substructures to opposite surfaces of the second conductive polymer layer to form a laminated structure; (4) isolating selected areas of the first and fourth metal layers to form, respectively, first and second arrays of external metal strips; (5) forming insulation areas on the exterior surfaces of the external metal strips; and (6) forming a plurality of first terminals, each electrically connecting a metal strip in the first internal array to a metal strip in the second external array, and a plurality of second terminals, each electrically connecting a metal strip in the first external array to a metal strip in the second internal array; and (7) singulating the laminated structure into a plurality of devices, each having three polymer layers connected in parallel between first and second terminals.

15 Claims, 5 Drawing Sheets

U.S. PATENT DOCUMENTS

| | | | |
|---|---|---|---|
| 2,978,665 | 4/1961 | Vernet et al. | 338/223 |
| 3,061,501 | 10/1962 | Dittman et al. | 156/250 |
| 3,138,686 | 6/1964 | Mitoff et al. | 200/142 |
| 3,187,164 | 6/1965 | Andrich | 219/504 |
| 3,243,753 | 3/1966 | Kohler | 338/31 |
| 3,535,494 | 10/1970 | Armbruster | 219/528 |
| 3,619,560 | 11/1971 | Buiting et al. | 219/300 |
| 3,689,736 | 9/1972 | Meyer | 219/222 |
| 3,823,217 | 7/1974 | Kampe | 264/105 |
| 3,824,328 | 7/1974 | Ting et al. | 174/52 PE |
| 3,878,501 | 4/1975 | Moorhead et al. | 338/22 R |
| 4,101,862 | 7/1978 | Takagi et al. | 338/23 |
| 4,151,401 | 4/1979 | Van Bokestal et al. | 219/508 |
| 4,177,376 | 12/1979 | Horsma et al. | 219/553 |
| 4,177,446 | 12/1979 | Diaz | 338/212 |
| 4,237,441 | 12/1980 | van Konyneburg et al. | 338/22 R |
| 4,238,812 | 12/1980 | Middleman et al.l | 361/106 |
| 4,246,468 | 1/1981 | Horsma | 219/553 |
| 4,250,398 | 2/1981 | Ellis et al. | 219/345 |
| 4,272,471 | 6/1981 | Walker | 264/104 |
| 4,314,230 | 2/1982 | Cardinal et al. | 338/314 |
| 4,314,231 | 2/1982 | Walty | 338/328 |
| 4,315,237 | 2/1982 | Middleman et al. | 338/22 R |
| 4,317,027 | 2/1982 | Middleman et al. | 219/553 |
| 4,327,351 | 4/1982 | Walker | 338/22 R |
| 4,329,726 | 5/1982 | Middleman et al. | 361/58 |
| 4,341,949 | 7/1982 | Steiner et al. | 219/553 |
| 4,352,083 | 9/1982 | Middleman et al. | 338/23 |
| 4,413,301 | 11/1983 | Middleman et al. | 361/106 |
| 4,426,633 | 1/1984 | Taylor | 338/25 |
| 4,445,026 | 4/1984 | Walker | 219/553 |
| 4,481,498 | 11/1984 | McTavish et al. | 338/20 |
| 4,542,365 | 9/1985 | McTavish et al. | 338/20 |
| 4,545,926 | 10/1985 | Foutz, Jr. et al. | 252/511 |
| 4,639,818 | 1/1987 | Cherian | 361/106 |
| 4,647,894 | 3/1987 | Ratell | 338/22 R |
| 4,647,896 | 3/1987 | Ratell | 338/22 R |
| 4,654,511 | 3/1987 | Horsma et al. | 219/548 |
| 4,685,025 | 8/1987 | Carlomagno | 361/106 |
| 4,689,475 | 8/1987 | Kleiner et al. | 219/553 |
| 4,698,614 | 10/1987 | Welch et al. | 338/22 R |
| 4,706,060 | 11/1987 | May | 338/20 |
| 4,732,701 | 3/1988 | Nishii et al. | 252/511 |
| 4,752,762 | 6/1988 | Inano et al. | 338/22 R |
| 4,766,409 | 8/1988 | Mandai | 338/22 R |
| 4,769,901 | 9/1988 | Nagahori | 29/621 |
| 4,774,024 | 9/1988 | Deep et al. | 252/511 |
| 4,787,135 | 11/1988 | Nagahori | 29/612 |
| 4,800,253 | 1/1989 | Kleiner et al. | 219/553 |
| 4,811,164 | 3/1989 | Ling et al. | 361/321 |
| 4,849,133 | 7/1989 | Yoshida et al. | 252/511 |
| 4,876,439 | 10/1989 | Nagahori | 219/541 |
| 4,882,466 | 11/1989 | Friel | 219/219 |
| 4,884,153 | 11/1989 | Deep et al. | 361/58 |
| 4,904,850 | 2/1990 | Claypool et al. | 219/548 |
| 4,907,340 | 3/1990 | Fang et al. | 29/610.1 |
| 4,924,074 | 5/1990 | Fang et al. | 219/548 |
| 4,937,551 | 6/1990 | Plasko | 338/22 R |
| 4,951,382 | 8/1990 | Jacobs et al. | 29/611 |
| 4,951,384 | 8/1990 | Jacobs et al. | 29/611 |
| 4,954,696 | 9/1990 | Ishii et al. | 219/548 |
| 4,955,267 | 9/1990 | Jacobs et al. | 29/611 |
| 4,967,176 | 10/1990 | Horsma et al. | 338/22 R |
| 4,980,541 | 12/1990 | Shafe et al. | 219/548 |
| 4,983,944 | 1/1991 | Uchida et al. | 338/22 R |
| 5,015,824 | 5/1991 | Monter et al. | 219/219 |
| 5,039,844 | 8/1991 | Nagahori | 219/541 |
| 5,049,850 | 9/1991 | Evans | 338/22 R |
| 5,057,674 | 10/1991 | Smith-Johannsen | 219/553 |
| 5,064,997 | 11/1991 | Fang et al. | 219/505 |
| 5,089,688 | 2/1992 | Fang et al. | 219/505 |
| 5,089,801 | 2/1992 | Chan et al. | 338/22 R |
| 5,140,297 | 8/1992 | Jacobs et al. | 338/22 R |
| 5,142,267 | 8/1992 | Fellner et al. | 338/23 |
| 5,148,005 | 9/1992 | Fang et al. | 219/505 |
| 5,164,133 | 11/1992 | Ishida et al. | 264/105 |
| 5,166,658 | 11/1992 | Fang et al. | 338/23 |
| 5,171,774 | 12/1992 | Ueno et al. | 524/495 |
| 5,174,924 | 12/1992 | Yamada et al. | 252/511 |
| 5,178,797 | 1/1993 | Evans | 252/508 |
| 5,181,006 | 1/1993 | Shafe et al. | 338/22 R |
| 5,190,697 | 3/1993 | Okita et al. | 252/511 |
| 5,195,013 | 3/1993 | Jacobs et al. | 361/106 |
| 5,210,517 | 5/1993 | Abe | 338/22 |
| 5,212,466 | 5/1993 | Yamada et al. | 338/22 R |
| 5,227,946 | 7/1993 | Jacobs et al. | 361/106 |
| 5,241,741 | 9/1993 | Sugaya | 29/612 |
| 5,247,277 | 9/1993 | Fang et al. | 338/22 R |
| 5,250,228 | 10/1993 | Baigrie et al. | 252/511 |
| 5,280,263 | 1/1994 | Sugaya | 338/22 R |
| 5,303,115 | 4/1994 | Nayar et al. | 361/106 |
| 5,351,390 | 10/1994 | Yamada et al. | 29/612 |
| 5,358,793 | 10/1994 | Hanada et al. | 428/560 |
| 5,493,266 | 2/1996 | Sasaki et al. | 338/22 R |
| 5,699,607 | 12/1997 | McGuire et al. | 29/612 |
| 5,802,709 | 9/1998 | Hogge et al. | 29/827 |
| 5,812,048 | 9/1998 | Ross, Jr. et al. | 338/128 |
| 5,831,510 | 11/1998 | Zhang et al. | 338/22 R |
| 5,852,397 | 12/1998 | Chan et al. | 338/22 R |
| 5,864,281 | 1/1999 | Zhang et al. | 338/22 R |

CONDUCTIVE POLYMER DEVICE AND METHOD OF MANUFACTURING SAME

CROSS-REFERENCE TO RELATED APPLICATIONS

This application is a Continuation-in-Part of application Ser. No. 09/035,196; filed Mar. 5, 1998 now U.S. Pat. No. 6,172,591.

FEDERALLY SPONSORED RESEARCH OR DEVELOPMENT

Not Applicable

BACKGROUND OF THE INVENTION

The present invention relates generally to the field of conductive polymer positive temperature coefficient (PTC) devices. More specifically, it relates to conductive polymer PTC devices that are of laminar construction, with more than a single layer of conductive polymer PTC material, and that are especially configured for surfacemount installations.

Electronic devices that include an element made from a conductive polymer have become increasingly popular, being used in a variety of applications. They have achieved widespread usage, for example, in overcurrent protection and self-regulating heater applications, in which a polymeric material having a positive temperature coefficient of resistance is employed. Examples of positive temperature coefficient (PTC) polymeric materials, and of devices incorporating such materials, are disclosed in the following U.S. patents:

U.S. Pat. No. 3,823,217—Kampe
U.S. Pat. No. 4,237,441—van Konynenburg
U.S. Pat. No. 4,238,812—Middleman et al.
U.S. Pat. No. 4,317,027—Middleman et al.
U.S. Pat. No. 4,329,726—Middleman et al.
U.S. Pat. No. 4,413,301—Middleman et al.
U.S. Pat. No. 4,426,633—Taylor
U.S. Pat. No. 4,445,026—Walker
U.S. Pat. No. 4,481,498—McTavish et al.
U.S. Pat. No. 4,545,926—Fouts, Jr. et al.
U.S. Pat. No. 4,639,818—Cherian
U.S. Pat. No. 4,647,894—Ratell
U.S. Pat. No. 4,647,896—Ratell
U.S. Pat. No. 4,685,025—Carlomagno
U.S. Pat. No. 4,774,024—Deep et al.
U.S. Pat. No. 4,689,475—Kleiner et al.
U.S. Pat. No. 4,732,701—Nishii et al.
U.S. Pat. No. 4,769,901—Nagahori
U.S. Pat. No. 4,787,135—Nagahori
U.S. Pat. No. 4,800,253—Kleiner et al.
U.S. Pat. No. 4,849,133—Yoshida et al.
U.S. Pat. No. 4,876,439—Nagahori
U.S. Pat. No. 4,884,163—Deep et al.
U.S. Pat. No. 4,907,340—Fang et al.
U.S. Pat. No. 4,951,382—Jacobs et al.
U.S. Pat. No. 4,951,384—Jacobs et al.
U.S. Pat. No. 4,955,267—Jacobs et al.
U.S. Pat. No. 4,980,541—Shafe et al.
U.S. Pat. No. 5,049,850—Evans
U.S. Pat. No. 5,140,297—Jacobs et al.

U.S. Pat. No. 5,171,774—Ueno et al.
U.S. Pat. No. 5,174,924—Yamada et al.
U.S. Pat. No. 5,178,797—Evans
U.S. Pat. No. 5,181,006—Shafe et al.
U.S. Pat. No. 5,190,697—Ohkita et al.
U.S. Pat. No. 5,195,013—Jacobs et al.
U.S. Pat. No. 5,227,946—Jacobs et al.
U.S. Pat. No. 5,241,741—Sugaya
U.S. Pat. No. 5,250,228—Baigrie et al.
U.S. Pat. No. 5,280,263—Sugaya
U.S. Pat. No. 5,358,793—Hanada et al.

One common type of construction for conductive polymer PTC devices is that which may be described as a laminated structure. Laminated conductive polymer PTC devices typically comprise a single layer of conductive polymer material sandwiched between a pair of metallic electrodes, the latter preferably being a highly-conductive, thin metal foil. See, for example, U.S. Pat. Nos. 4,426,633—Taylor; 5,089,801—Chan et al.; 4,937,551—Plasko; 4,787,135—Nagahori; 5,669,607—McGuire et al.; and 5,802,709—Hogge et al.; and International Publication Nos. WO97/06660 and WO98/12715.

A relatively recent development in this technology is the multilayer laminated device, in which two or more layers of conductive polymer material are separated by alternating metallic electrode layers (typically metal foil), with the outermost layers likewise being metal electrodes. The result is a device comprising two or more parallel-connected conductive polymer PTC devices in a single package. The advantages of this multilayer construction are reduced surface area ("footprint") taken by the device on a circuit board, and a higher current-carrying capacity, as compared with single layer devices.

In meeting a demand for higher component density on circuit boards, the trend in the industry has been toward increasing use of surface mount components as a space-saving measure. Surface mount conductive polymer PTC devices heretofore available have been generally limited to hold currents below about 2.5 amps for packages with a board footprint that generally measures about 9.5 mm by about 6.7 mm. Recently, devices with a footprint of about 4.7 mm by about 3.4 mm, with a hold current of about 1.1 amps, have become available. Still, this footprint is considered relatively large by current surface mount technology (SMT) standards.

The major limiting factors in the design of very small SMT conductive polymer PTC devices are the limited surface area and the lower limits on the resistivity that can be achieved by loading the polymer material with a conductive filler (typically carbon black). The fabrication of useful devices with a volume resistivity of less than about 0.2 ohm-cm has not been practical. First, there are difficulties inherent in the fabrication process when dealing with such low volume resistivities. Second, devices with such a low volume resistivity do not exhibit a large PTC effect, and thus are not very useful as circuit protection devices.

The steady state heat transfer equation for a conductive polymer PTC device may be given as:

$$0=[I^2R(f(T_d))]-[U(T_d-T_a)], \tag{1}$$

where I is the steady state current passing through the device; $R(f(T_d))$ is the resistance of the device, as a function of its temperature and its characteristic "resistance/temperature function" or "R/T curve"; U is the effective heat transfer coefficient of the device; $T_d$ is temperature of the device; and $T_a$ is the ambient temperature.

The "hold current" for such a device may be defined as the value of I necessary to trip the device from a low resistance state to a high resistance state. For a given device, where U is fixed, the only way to increase the hold current is to reduce the value of R.

The governing equation for the resistance of any resistive device can be stated as $$R=\rho L/A, \tag{2}$$

where ρ is the volume resistivity of the resistive material in ohm-cm, L is the current flow path length through the device in cm, and A is the effective cross-sectional area of the current path in $cm^2$.

Thus, the value of R can be reduced either by reducing the volume resistivity ρ, or by increasing the cross-sectional area A of the device.

The value of the volume resistivity ρ can be decreased by increasing the proportion of the conductive filler loaded into the polymer. The practical limitations of doing this, however, are noted above.

A more practical approach to reducing the resistance value R is to increase the cross-sectional area A of the device. Besides being relatively easy to implement (from both a process standpoint and from the standpoint of producing a device with useful PTC characteristics), this method has an additional benefit: In general, as the area of the device increases, the value of the heat transfer coefficient also increases, thereby further increasing the value of the hold current.

In SMT applications, however, it is necessary to minimize the effective surface area or footprint of the device. This puts a severe constraint on the effective cross-sectional area of the PTC element in the device. Thus, for a device of any given footprint, there is an inherent limitation in the maximum hold current value that can be achieved. Viewed another way, decreasing the footprint can be practically achieved only by reducing the hold current value.

There has thus been a long-felt need for SMT conductive polymer PTC devices that have very small footprints while achieving relatively high hold currents. Applicant's co-pending application Ser. No. 09/035,196 (the disclosure of which is incorporated herein by reference) discloses a multilayer SMT conductive polymer PTC device that meets these criteria, as well as a method for fabricating such a device. More efficient and economical methods of manufacturing such devices have, nevertheless, been sought. Furthermore, even higher hold currents for a given footprint continue to be desired.

SUMMARY OF THE INVENTION

Broadly, the present invention is a conductive polymer PTC device that has a relatively high hold current while maintaining a very small circuit board footprint. This result is achieved by a multilayer construction that provides an increased effective cross-sectional area A of the current flow path for a given circuit board footprint. In effect, the multilayer construction of the invention provides, in a single, small-footprint surface mount package, three or more PTC devices electrically connected in parallel.

In one aspect, the present invention is a conductive polymer PTC device comprising, in a preferred embodiment, multiple alternating layers of metal foil and PTC conductive polymer material, with electrically conductive interconnections to form three or more conductive polymer PTC devices connected to each other in parallel, and with termination elements configured for surface mount termination.

Specifically, two of the metal layers form, respectively, first and second external electrodes, while the remaining metal layers form a plurality of internal electrodes that physically separate and electrically connect three or more conductive polymer layers located between the external electrodes. First and second terminals are formed so as to be in physical contact with all of the conductive polymer layers. The electrodes are staggered to create two sets of alternating electrodes: a first set that is in electrical contact with the first terminal, and a second set that is in electrical contact with the second terminal. One of the terminals serves as an input terminal, and the other serves as an output terminal.

A specific embodiment of the invention comprises first, second, and third conductive polymer PTC layers. A first external electrode is in electrical contact with the second terminal and with an exterior surface of the first conductive polymer layer that is opposed to the surface facing the second conductive polymer layer. A second external electrode is in electrical contact with the first terminal and with an exterior surface of the third conductive polymer layer that is opposed to the surface facing the second conductive polymer layer. The first and second conductive polymer layers are separated by a first internal electrode that is in electrical contact with the first terminal, while the second and third conductive polymer layers are separated by a second internal electrode that is in electrical contact with the second terminal.

In such an embodiment, if the first terminal is an input terminal and the second terminal is an output terminal, the current flow path is from the first terminal to the first internal electrode and the second external electrode. From the first internal electrode, current flows to the second terminal through the first conductive polymer layer and the first external electrode, and through the second conductive polymer layer and the second internal electrode. From the second external electrode, current flows to the second terminal through the third conductive polymer layer and the second internal electrode.

Thus, the resulting device is, effectively, three PTC devices connected in parallel. This construction provides the advantages of a significantly increased effective cross-sectional area for the current flow path, as compared with a single layer device, without increasing the footprint. Thus, for a given footprint, a larger hold current can be achieved.

A specific improvement of the present invention is characterized by a fully-metallized external surface on each of the first and second external electrodes to provide a large surface area for the adhesion of the upper and lower ends of the first and second terminals to the first and second electrodes, respectively. The improvement is further characterized by an external insulation layer applied over the metallized external electrode surfaces between the ends of the first and second terminals to provide electrical isolation between the first and second terminals, wherein the external insulation layer is flush with the upper and lower ends of the terminals.

The above-described improvement provides several advantages over prior multilayer conductive polymer PCT devices, all stemming essentially from the ability to provide a larger adhesion "patch" between the terminal ends and the external electrodes. Specifically, this structure yields enhanced solder joint strength between the terminals and the external electrodes, enhanced heat dissipation qualities, and lower contact resistance at the terminal junctures. The latter two qualities, in turn, contribute to higher hold currents for a given size device.

In another aspect, the present invention is a method of fabricating the above-described device. For a device having three conductive polymer PTC layers, this method comprises the steps of: (1) providing (a) a first laminated substructure comprising a first conductive polymer PTC layer sandwiched between first and second metal layers, (b) a second conductive polymer PTC layer, and (c) a second laminated substructure comprising a third conductive polymer PTC layer sandwiched between third and fourth metal layers; (2) isolating selected areas of the second and third metal layers to form, respectively, first and second internal arrays of internal metal strips; (3) laminating the first and second laminated substructures to opposite surfaces of the second conductive polymer PTC layer to form a laminated structure comprising the first conductive polymer layer sandwiched between the first and second metal layers, the second conductive polymer PTC layer sandwiched between the second and third metal layers, and the third conductive polymer PTC layer sandwiched between the third and fourth metal layers; (4) isolating selected areas of the first and fourth metal layers to form, respectively, first and second external arrays of external metal strips; (5) forming a plurality of insulation areas on the exterior surfaces of each of the external metal strips; and (6) forming a plurality of first terminals, each electrically connecting one of the internal metal strips in the first internal array to one of the external metal strips in the second external array, and a plurality of second terminals, each electrically connecting one of the external metal strips in the first external array to one of the internal metal strips in the second internal array, wherein each of the first terminals is separated from a second terminal by one of the insulation areas on each of the first and second external arrays.

More specifically, the step of isolating selected areas of the second and third metal layers includes the step of etching a series of parallel, linear interior isolation gaps in each of the second and third metal layers to form first and second internal arrays of isolated parallel metal strips. The interior isolation gaps in the second and third metal layers are staggered so that the isolated metal strips in the first internal array are staggered with respect to those in the second internal array.

The step of isolating selected areas of the first and fourth metal layers includes the steps of (a) forming a series of parallel linear slots through the laminated structure, each of the slots passing through one of the interior isolation gaps in either the second or third metal layer; (b) plating the side walls of the slots and the exterior surfaces of the first and fourth metal layers with a conductive metal plating; and (c) etching a series of parallel, linear exterior isolation gaps in each of the first and fourth metal layers (including the metal plating applied thereto), wherein the isolation gaps in the first metal layer are adjacent a first set of slots, and the isolation gaps in the fourth metal layer are adjacent a second set of slots that alternate with the first set. Thus, the first external array of isolated metal strips comprises a first plurality of wide external metal strips in the first metal layer, each defined between a slot and an exterior isolation gap, while the second external array of isolated metal strips comprises a second plurality of wide external metal strips in the fourth metal layer, each defined between a slot and an external isolation gap, wherein the wide external metal strips in the first array are on the opposite sides of the slots from the wide external metal strips in the second array. Furthermore, because of the asymmetric spacing of the isolation gaps between successive slots, each isolation gap separates one of the wide external metal strips from a narrow external metal band, and each slot has a narrow metal band on one side and a wide metal strip on the other side.

The step of forming a plurality of insulation areas comprises the step of screen printing a layer of insulation material on both of the external surfaces of the laminated structure, along each of the wide external metal strips. The insulation layers are applied so that the isolation gaps are filled with insulation material, but a substantial portion of each of the wide external metal strips along each of the slots is left uncovered or exposed. The narrow metal bands are also left uncovered.

The step of forming the first and second terminals comprises the step of overlaying a solder plating over the metal-plated surfaces that are not covered by the insulation layer. The solder plating is thus applied to the interior wall surfaces of the slots, the narrow external metal bands, and the exposed portions of the wide external metal strips.

The final step of the fabrication process comprises the step of singulating the laminated structure into a plurality of individual conductive polymer PTC devices, each of which has the structure described above. Specifically, the wide external metal strips in the first and fourth metal layers are formed, by the singulation step, respectively into first and second pluralities of external electrodes, while the isolated metal areas in the first and second internal arrays are thereby respectively formed into first and second pluralities of internal electrodes.

While a device having three conductive polymer PTC layers is described herein, it will be appreciated that a device having two such layers, or four or more such layers, can be constructed in accordance with the present invention. Thus, the above-described fabrication method can be readily modified to manufacture devices with two conductive polymer PTC layers, or with four or more such layers.

The above-mentioned advantages of the present invention, as well as others, will be more readily appreciated from the detailed description that follows.

DETAILED DESCRIPTION OF THE INVENTION

Figure 1:
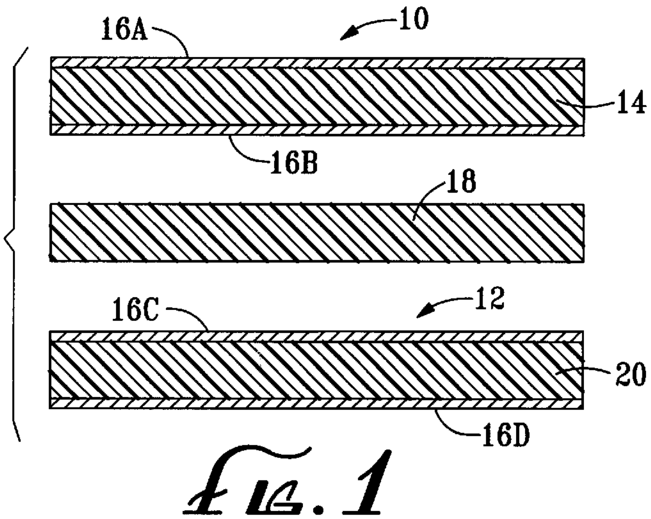
FIG. 1 is a cross-sectional view of the laminated substructures and a middle conductive polymer PTC layer, illustrating the first step of a conductive polymer PTC device fabrication method in accordance with a first preferred embodiment of the present invention.

Referring now to the drawings, FIG. 1 illustrates a first laminated substructure or web 10, and a second laminated substructure or web 12. The first and second webs 10, 12 are provided as the initial step in the process of fabricating a conductive polymer PTC device in accordance with the present invention. The first laminated web 10 comprises a first layer 14 of conductive polymer PTC material sandwiched between first and second metal layers 16*a*, 16*b*. A second or middle layer 18 of conductive polymer PTC material is provided for lamination between the first web 10 and the second web 12 in a subsequent step in the process, as will be described below. The second web 12 comprises a third layer 20 of conductive polymer PTC material sandwiched between third and fourth metal layers 16*c*, 16*d*. The conductive polymer PTC layers 14, 18, 20 may be made of any suitable conductive polymer PTC composition, such as, for example, high density polyethylene (HDPE) into which is mixed an amount of carbon black that results in the desired electrical operating characteristics. See, for example, U.S. Pat. No. 5,802,709—Hogge et al., , assigned to the assignee of the present invention, the disclosure of which is incorporated herein by reference.

The metal layers 16*a*, 16*b*, 16*c*, and 16*d* may be made of copper or nickel foil, with nickel being preferred for the second and third (internal) metal layers 16*b*, 16*c*. If the metal layers 16*a*, 16*b*, 16*c*, 16*d* are made of copper foil, those foil surfaces that contact the conductive polymer layers are coated with a nickel flash coating (not shown) to prevent unwanted chemical reactions between the polymer and the copper. These polymer contacting surfaces are also preferably "nodularized", by well-known techniques, to provide a roughened surface that provides good adhesion between the metal and the polymer. Thus, in the illustrated embodiment, the second and third (internal) metal layers 16*b*, 16*c* are nodularized both surfaces, while the first and fourth (external) metal layers 16*a*, 16*d* are nodularized only on the single surface that contacts an adjacent conductive polymer layer.

The laminated webs 10, 12 may themselves be formed by any of several suitable processes that are known in the art, as exemplified by U.S. Pat. Nos. 4,426,633—Taylor; 5,089,801—Chan et al.; 4,937,551—Plasko; and 4,787,135—Nagahori, with the process disclosed in U.S. Pat. No. 5,802,709—Hogge et al. and International Publication No. WO97/06660 being preferred.

Figure 2:
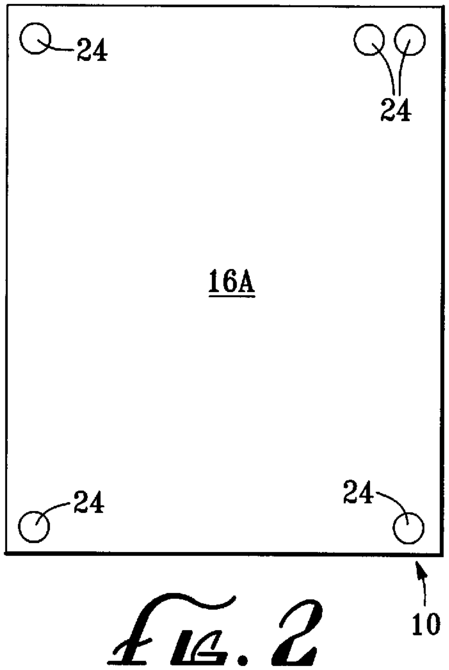
FIG. 2 is a top plan view of the first (upper) laminated substructure of FIG. 1.

It is advantageous at this point to provide some means for maintaining the webs 10, 12 and the middle conductive polymer PTC polymer layer 18 in the proper relative orientation or registration for carrying out the subsequent steps in the fabrication process. Preferably, this is done by forming (e.g., by punching or drilling) a plurality of registration holes 24 in the corners of the webs 10, 12 and the middle polymer layer 18, as shown in FIG. 2. Other registration techniques, well known in the art, may also be used.

Figure 3:
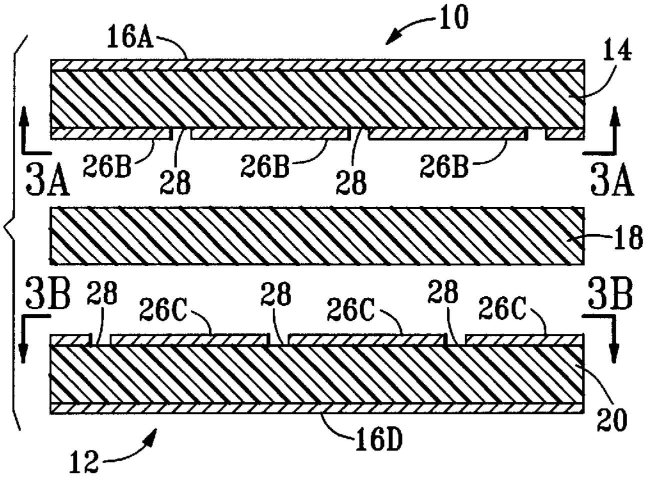
FIG. 3 is a cross-sectional view, similar to that of FIG. 1, after the performance of the step of creating first and second internal arrays of isolated metal areas respectively in the second and third metal layers of the laminated substructures of FIG. 1.
Figure 3C:
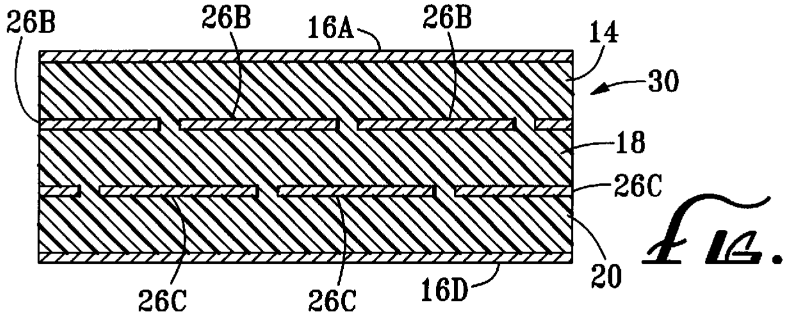
FIG. 3C is a cross-sectional view, similar to that of FIG. 3, but showing the laminated structure formed after the lamination of the substructures and the middle conductive polymer PTC layer of FIG. 3.
Figure 3A:
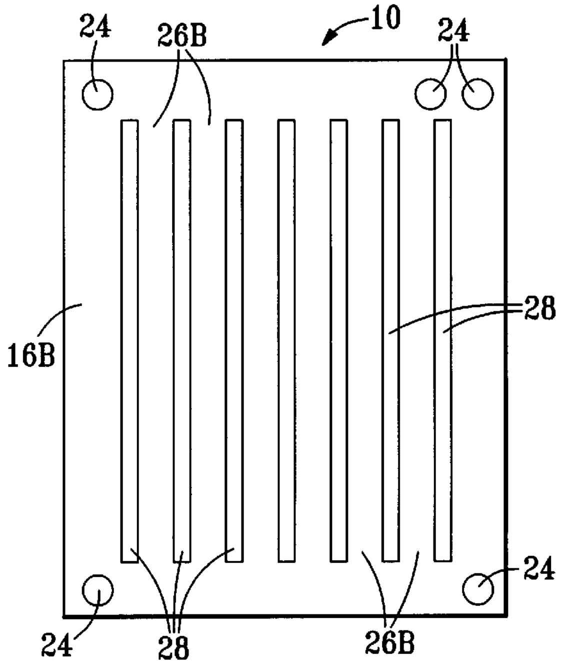
FIG. 3A is a plan view of the second metal layer, taken along line 3A—3A of FIG. 3.
Figure 3B:
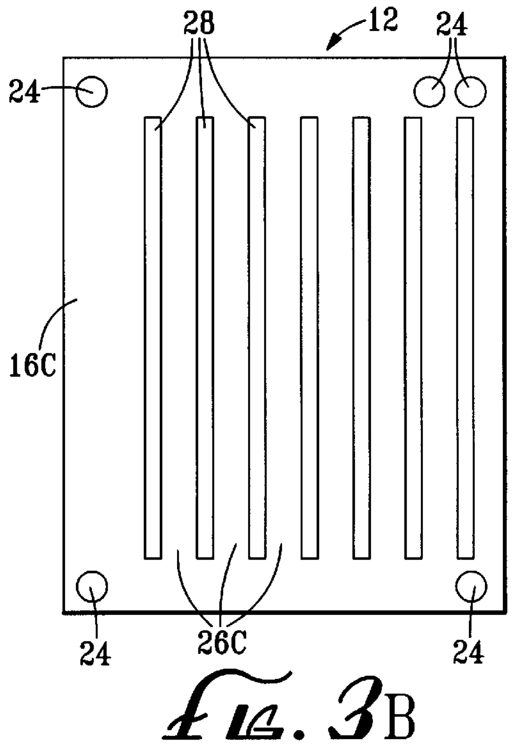
FIG. 3B is a plan view of the third metal layer, taken along line 3B—3B of FIG. 3.

The next step in the process is illustrated in FIGS. 3, 3A, and 3B. In this step, a pattern of metal in each of the second and third (internal) metal layers 16*b*, 16*c* is removed to form first and second internal arrays of isolated parallel metal strips 26*b*, 26*c*, respectively, in the internal metal layers 16*b*, 16*c*. Specifically, a first series of parallel, linear interior isolation gaps 28 is formed in the second metal layer 16*b*, and a second series of parallel, linear isolation gaps is formed in the third metal layer 16*c*, with the interior metal strips 26*b*, 26*c* being defined between the interior isolation gaps 28 in the second and third metal layers 16*b*, 16*c*, respectively. The metal removal to form the gaps 28 is accomplished by means of standard techniques used in the fabrication of printed circuit boards, such as those techniques employing photoresist and etching methods. The removal of the metal results in a linear isolation gap 28 between adjacent metal strips 26*b*, 26*c* in each of the internal metal layers 16*b*, 16*c*. The interior isolation gaps 28 in the second and third metal layers are staggered so that the isolated metal strips 26*b* in the first internal array (in the second metal layer 16*b*) are staggered with respect to the isolated metal strips 26*c* in the second internal array (in the third metal layer 16*c*).

Figure 3D:
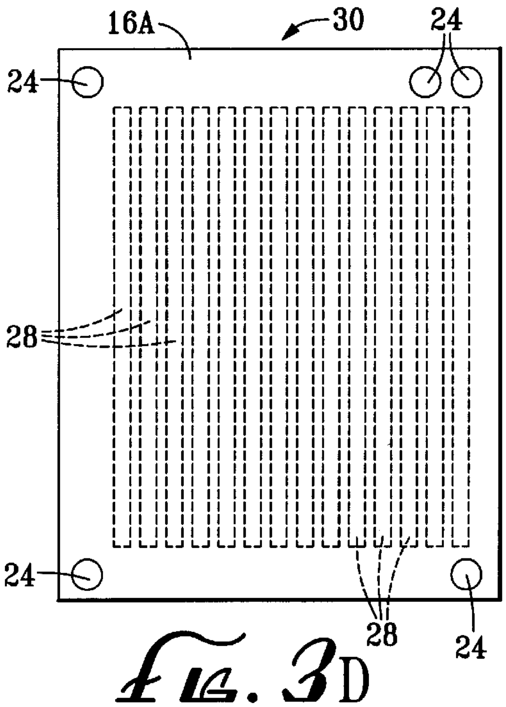
FIG. 3D is a top plan view of the laminated structure of FIG. 3C, showing the etched isolation gaps in the second and third metal layers in phantom outline.

Ensuring that the webs 10, 12 and the middle conductive polymer PTC layer 18 are in proper registration, the middle conductive polymer PTC layer 18 is laminated between the webs 10, 12 by a suitable laminating method, as is well known in the art. The lamination may be performed, for example, under suitable pressure and at a temperature above the melting point of the conductive polymer material, whereby the material of the conductive polymer layers 14, 18, and 20 flows into and fills the isolation gaps 28. The laminate is then cooled to below the melting point of the polymer while maintaining pressure. The result is a laminated structure 30, as shown in FIGS. 3C and 3D. At this point, the polymeric material in the laminated structure 30 may be cross-linked, by well-known methods, if desired for the particular application in which the device will be employed.

Figure 4:
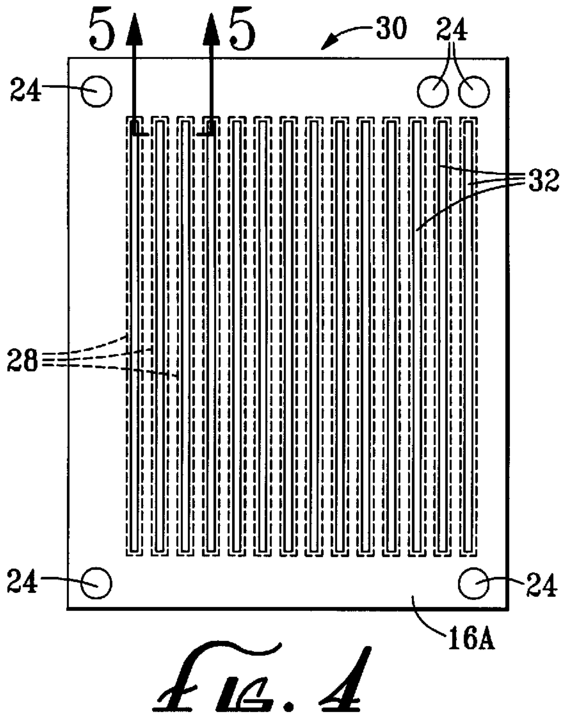
FIG. 4 is a top plan view of the laminated structure after the performance of the step of forming slots through the laminated structure.
Figure 5:
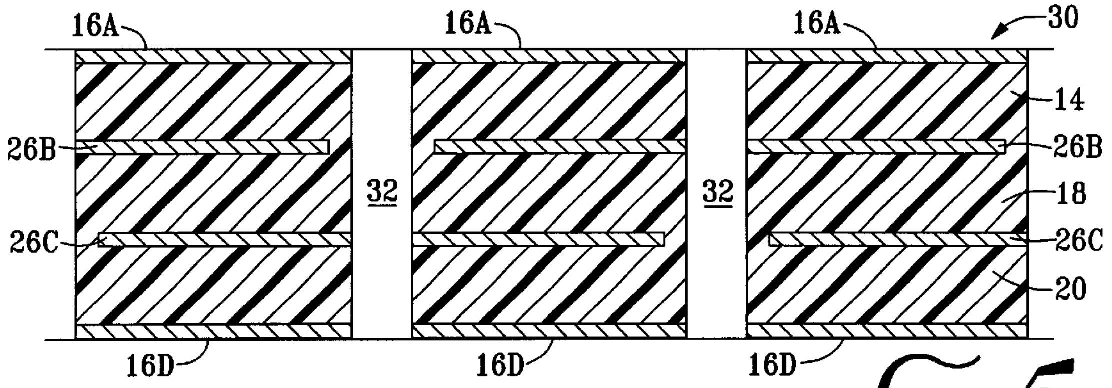
FIG. 5 is a cross-sectional view, taken along line 5—5 of FIG. 4.

After the laminated structure 30 has been formed, a series of parallel, linear slots 32 is formed through the laminated structure 30, as shown in FIGS. 4 and 5. The slots 32 may be formed by drilling, routing, or punching the laminated structure 30 completely through the four metal layers 16*a*, 16*b*, 16*c*, 16*d*, and the three polymer layers 14, 18, and 20. Each of the slots 32 passes through one of the interior isolation gaps 28 in either the second metal layer 16*b* or the third metal layer 16*c*.

Figure 6:
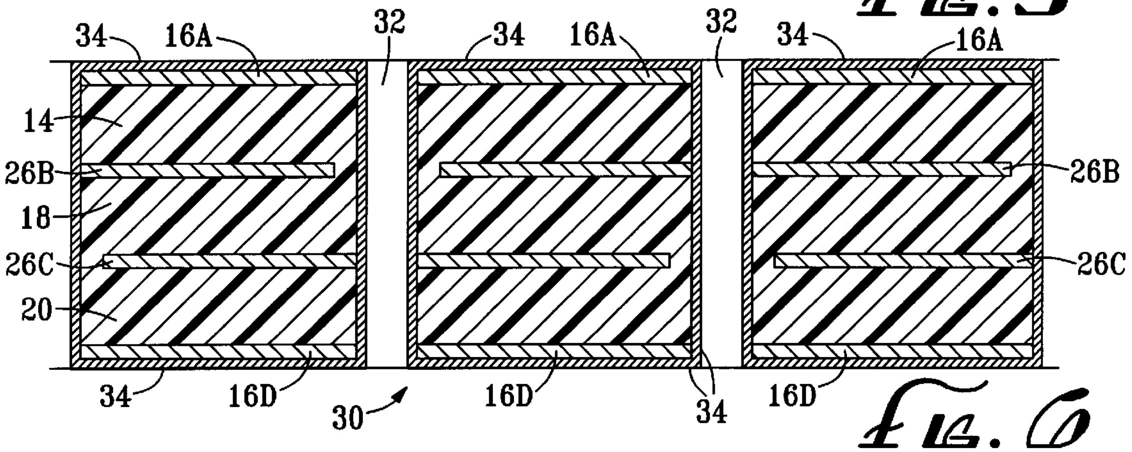
FIG. 6 is a cross-sectional view, similar to that of FIG. 5, after the performance of the step of metal-plating the side walls of the slots and the external surfaces of the laminated structure.

Next, as shown in FIG. 6, the exposed exterior surfaces of the first and fourth (external) metal layers 16*a*, 16*d*, and the interior wall surfaces of the slots 32 are coated with a plating layer 34 of conductive metal, such as tin, nickel, or copper, with copper being preferred. Alternatively, the plating layer 34 may comprise a layer of copper over a very thin base layer (not shown) of nickel, for improved adhesion. This metal plating step can be performed by any suitable process, such as electrodeposition, for example. The metal plating layer 34 may be defined as having a first portion that is applied to the interior wall surfaces of the slots 32, and second and third portions that are applied to the external surfaces of the first and fourth metal layers 16*a*, 16*d*, respectively.

Figure 7:
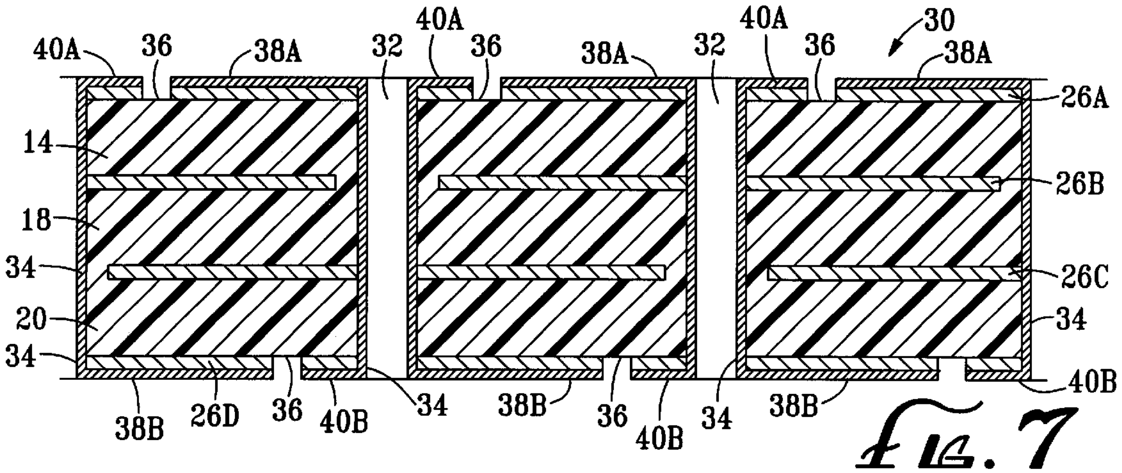
FIG. 7 is a cross-sectional view similar to that of FIG. 6, after the performance of the step of forming isolation gaps in the external surfaces of the laminated structure.

FIG. 7 illustrates the step of forming a series of parallel, linear exterior isolation gaps 36 in each of the first and fourth metal layers 16*a*, 16*d*, including the metal plating layer 34 applied thereto. The external isolation gaps 36 in the first metal layer are adjacent a first set of slots 32, and the external isolation gaps 36 in the fourth metal layer are adjacent a second set of slots 32 that alternate with the first set. The exterior isolation gaps 36 may be formed by the same process as that used to form the interior isolation gaps 28, as discussed above.

The external isolation gaps 36 divide the first metal layer 16*a* into a first plurality of external metal strips 38*a*, each defined between a slot 32 and an exterior isolation gap 36, and they divide the fourth metal layer 16*d* into a second plurality of external metal strips 38*b* in the fourth metal layer, each defined between a slot 32 and an exterior isolation gap 36, wherein the external metal strips 38*a* in the first array are on the opposite sides of the slots 32 from the external strips 38*b* in the second array. Furthermore, because of the asymmetric spacing of the external isolation gaps 36 between successive slots 32 , each external isolation gap 36 separates one of the external metal strips 38*a*, 38*b* from a narrow external metal band 40*a*, 40*b*, respectively, and each slot 32 has a narrow metal band 40*a* or 40*b* on one side and a metal strip 38*a* or 38*b* on the other side. Each of the metal strips 38*a*, 38*b* and the narrow metal bands 40*a*, 40*b* comprises an inner foil layer and an outer metal-plated layer.

Figure 8:
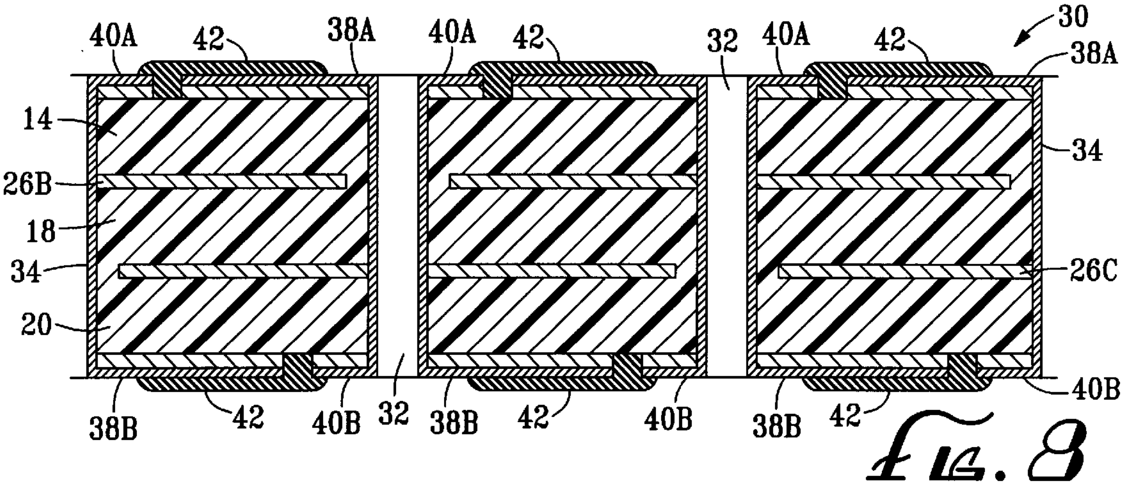
FIG. 8 is a cross-sectional, similar to that of FIG. 7, after the performance of the step of forming insulative isolation areas on the external surfaces of the laminated structure.

FIG. 8 illustrates the step of forming a plurality of insulation areas 42 on both of the major external surfaces (i.e., the top and bottom surfaces) of the laminated structure 30. This step is advantageously performed by screen printing a layer of insulation material on both of the appropriate surfaces of the laminated structure 30, along each of the external metal strips 38*a*, 38*b*. The insulation areas 42 are configured so that the external isolation gaps 36 are filled with insulation material, but a substantial portion of each of the metal-plated external metal strips 38*a*, 38*b* along each of the slots 32 is left uncovered or exposed. Although the insulation areas 42 may cover a small adjacent portion of the narrow bands 40*a*, 40*b*, most, if not all, of the surface area of each of the narrow bands 40*a*, 40*b* is left uncovered by the insulation layers 42.

Figure 9:
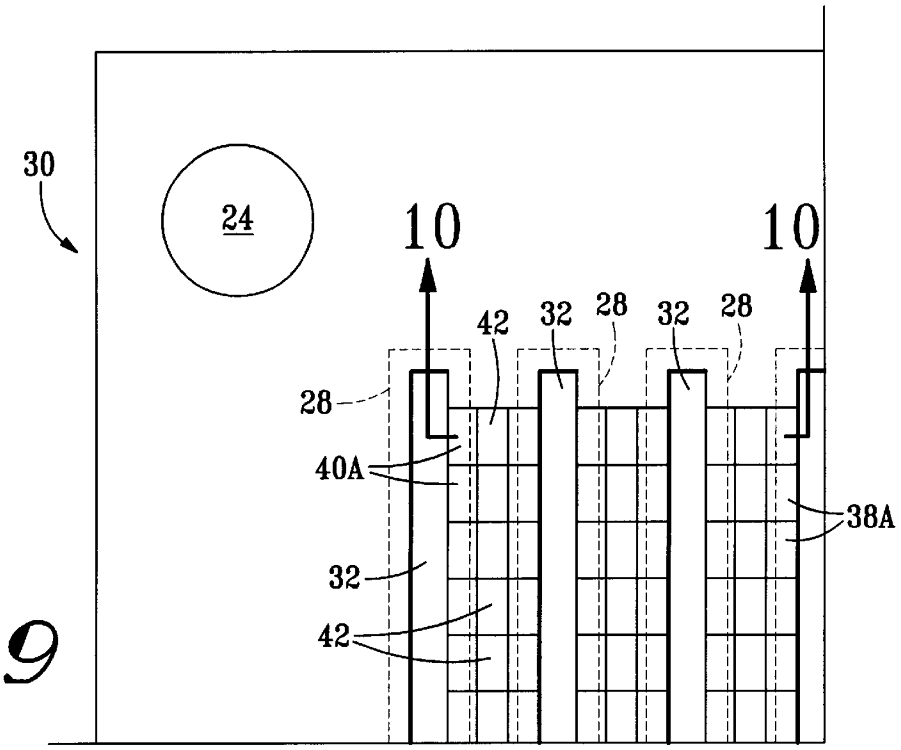
FIG. 9 is a plan view of a portion of the laminated structure after the performance of the step of forming the terminals.
Figure 10:
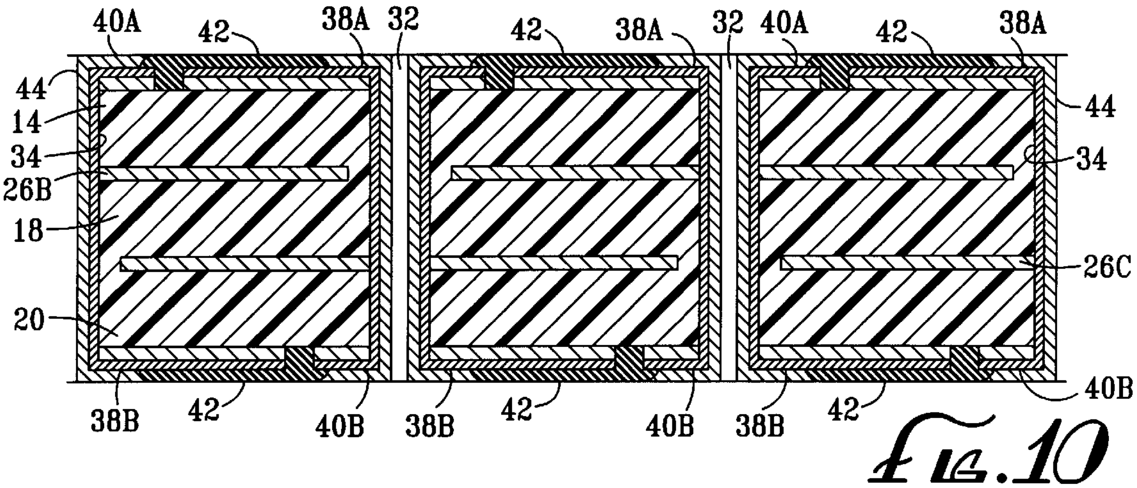
FIG. 10 is a cross-sectional view taken along line 10—10 of FIG. 9.

Then, as shown in FIGS. 9 and 10, the areas that were metal-plated with the plating layer 34 in the step discussed above in connection with FIG. 6 are again plated with a thin solder coating 44. The solder coating 44, which is preferably applied by electroplating, but which can be applied by any other suitable process that is well-known in the art (e.g., reflow soldering or vacuum deposition), covers the portion of the metal plating layer 34 that was applied to the interior wall surfaces of the slots 32, and those portions of the external strips 38*a*, 38*b* and the narrow metal bands 40*a*, 40*b* that are left uncovered by the insulation layers 42. It is important that the solder coating 44 is flush with the insulation layer 42. Therefore, the thicknesses of both the insulation layer 42 and the solder coating 44 must be controlled to assure that a substantially flush surface is provided on both the top and bottom surfaces of the laminated structure 30, as shown in FIG. 10.

Figure 11:
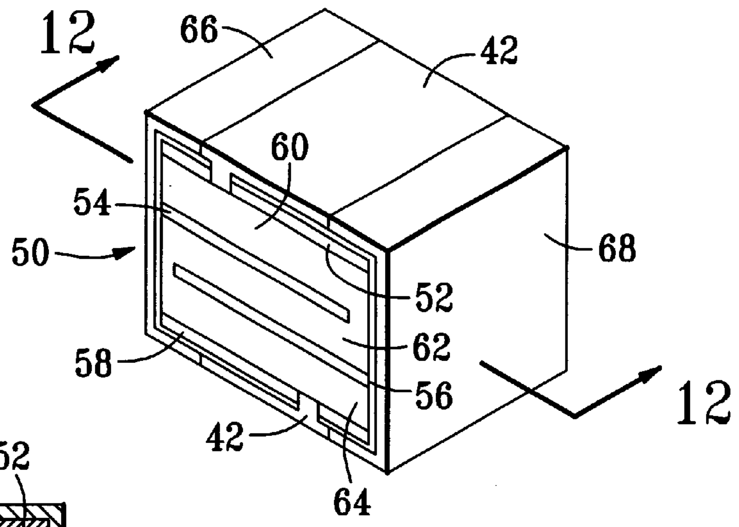
FIG. 11 is a perspective view of a multilayer, conductive polymer PTC device after singulation from the laminated structure.
Figure 12:
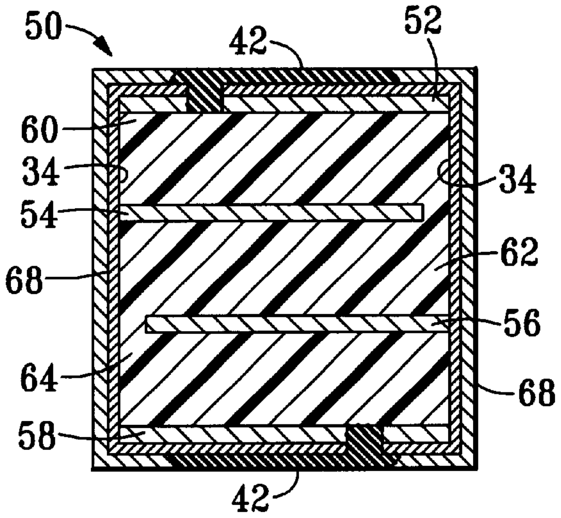
FIG. 12 is a cross-sectional view taken along line 12—12 of FIG. 11.

Finally, the laminated structure 30 is singulated (by well-known techniques) preferably along a grid of score lines (not shown) to form a plurality of individual conductive polymer PTC devices, one of which is shown in FIGS. 11 and 12, designated by the numeral 50. After singulation, the device includes a first external electrode 52, formed from one of the first external array of external metal strips 38*a*; a first internal electrode 54, formed from one of the first internal array of internal metal strips 26*b*; a second internal electrode 56, formed from one of the second array of internal metal strips 26*c*; and a second external electrode 58, formed from one of the second array of external metal strips 38*b*. A first conductive polymer PTC element 60, formed from the first polymer layer 14, is located between the first external electrode 52 and the first internal electrode 54; a second conductive polymer PTC element 62, formed from the second polymer layer 18, is located between the first internal electrode 54 and the second internal electrode 56; and a third conductive polymer PTC element 64, formed from the third polymer layer 20, is located between the second internal electrode 56 and the second external electrode 58.

The solder plating layer 44, described above, provides first and second conductive terminals 66, 68 on opposite ends of the device 50. The first and second terminals 66, 68 form the entire end surfaces and parts of the top and bottom surfaces of the device 50. The remaining portions of the top and bottom surfaces of the device 50 are formed by the insulation layers 42, which electrically isolate the first and second terminals 66, 68 from each other.

As best seen in FIG. 12, the first terminal 66 is in intimate physical contact with the first internal electrode 54 and the second external electrode 58. The second terminal 58 is in intimate physical contact with the first external electrode 52*d* and the second internal electrode 56. The first terminal 66 is also in contact with a top metal segment 70*a*, which is formed from one of the above-described narrow metal bands 40*a*, while the second terminal 68 is in contact with a second metal segment 70*b*, which is formed from the other of the narrow metal bands 40*b*. The metal segments 70*a*, 70*b*are of such small area as to have a negligible current-carrying capacity, and thus do not function as electrodes, as will be seen below.

For the purposes of this description, the first terminal 66 may be considered an input terminal, and the second terminal 68 may be considered an output terminal, but these assigned roles are arbitrary, and the opposite arrangement may be employed. With the terminals 66, 68 so defined, the current path through the device 50 is as follows: From the input terminal 66 current flows (a) through the first internal electrode 54, the first conductive polymer PTC layer 14, and the first external electrode 52 to the output terminal 68; (b) through the first internal electrode 54, the second conductive polymer PTC layer 18, and the second internal electrode 56, to the output terminal 68; and (c) through the second external electrode 58, the third conductive polymer PTC layer 20 and the second internal electrode 56, to the output terminal 68. This current flow path is equivalent to connecting the conductive polymer PTC layers 14, 18, and 20 in parallel between the input and output terminals 66, 68.

It will be appreciated that the device constructed in accordance with the above described fabrication process is very compact, with a small footprint, and yet it can achieve relatively high hold currents.

The device 50 in accordance with the present invention is characterized by the fully-metallized layer 34 on the surface on each of the first and second external electrodes 52, 58 to provide a large surface area for the adhesion of the upper and lower ends of the first and second terminals 66, 68 on the upper and lower surfaces, respectively, of the device 50. The improvement is further characterized by the external insulation layer 42 applied over the metallized external surfaces of the external electrodes 52, 58, between the ends of the first and second terminals 66, 68, to provide electrical isolation between the first and second terminals 66, 68, wherein the external insulation layer 42 is flush with the solder plating of the terminals 66, 68 on the upper and lower surfaces of the device 50.

The above-described improvement provides several advantages over prior multilayer conductive polymer PTC devices, all stemming essentially from the ability to provide a larger adhesion "patch" between the terminal ends and the external electrodes 52, 58. Specifically, this structure yields enhanced solder joint strength between the terminals 66, 68 and the external electrodes 52, 58, enhanced heat dissipation qualities, and lower contact resistance at the terminal junctures. The latter two qualities, in turn, contribute to higher hold currents for a given size device. Of significant importance is that a larger area of overlap is provided between successive electrodes than has heretofore been achieved in a multilayer polymer PTC device, thereby increasing the effective current-carrying cross-sectional area of the device. This, in turn, further increases the hold current for a given footprint.

It will be appreciated that the fabrication method described above may be easily modified to manufacture a device comprising a single conductive polymer layer sandwiched between two electrodes, with a terminal electrically connected to each electrode, the terminals being electrically isolated from each other by insulation layers on the upper and lower exterior surfaces of the device. Specifically, such a method would comprise the steps of: (1) providing a laminated structure comprising a first conductive polymer layer sandwiched between first and second metal layers; (2) isolating selected areas of the first and second metal layers to form, respectively, first and second arrays of metal strips; (3) forming a first plurality of insulation areas on the exterior surface of each of the first array of metal strips and a second plurality of insulation areas on the exterior surface of each of the second array of metal strips; (4) forming a plurality of first terminals, each electrically connected to one of the metal strips in the first array, and a plurality of corresponding second terminals, each electrically connected to one of the metal strips in the second array, each of the first terminals being isolated from a corresponding second terminal by one of the first plurality of insulation areas and one of the second plurality of insulation areas; and (5) separating the laminated structure into a plurality of devices, each comprising a conductive polymer layer sandwiched between a first electrode formed from one of the metal strips in the first array and a second electrode formed from one of the metal strips in the second array; a first terminal in electrical contact only with the first electrode; and a second terminal in electrical contact only with the second electrode.

In the single layer embodiment, the step of isolating selected areas of the first and second metal layers comprises the steps of: (2)(a) forming a series of substantially parallel linear slots through the laminated structure; (2)(b) plating the internal side walls of the slots and the exterior surfaces of the first and second metal layers with a conductive metal plating layer; and (2)(c) etching a series of substantially linear isolation gaps in each of the first and second metal layers, including the metal plating layer applied thereto. The steps of forming the insulation areas and forming the terminals would be performed substantially as described above with respect to the multilayer embodiment, with the proviso that the terminals are formed so that each of the first plurality of terminals electrically contacts only the first electrode, and each of the second plurality of terminals contacts only the second electrode.

While exemplary embodiments have been described in detail in this specification and in the drawings, it will be appreciated that a number of modifications and variations may suggest themselves to those skilled in the pertinent arts. For example, the fabrication process described herein may be employed with conductive polymer compositions of a wide variety of electrical characteristics, and is thus not limited to those exhibiting PTC behavior. It will also be readily apparent that the fabrication method described above may be easily adapted to the manufacture of a device having fewer than three or more than three conductive polymer layers. Furthermore, while the present invention is most advantageous in the fabrication of SMT devices, it may be readily adapted to the fabrication of multilayer conductive polymer devices having a wide variety of physical configurations and board mounting arrangements. These and other variations and modifications are considered the equivalents of the corresponding structures or process steps explicitly described herein, and thus are within the scope of the invention as defined in the claims that follow.

What is claimed is:

1. An electronic device having first and second opposed end surfaces, the device comprising:

first, second, and third conductive polymer layers, each having first and second opposed surfaces;

the first and second conductive polymer layers being separated by a first internal electrode that is in electrical contact with the second surface of the first conductive polymer layer and with the first surface of the second conductive polymer layer;

the second and third conductive polymer layers being separated by a second internal electrode that is in electrical contact with the second surface of the second conductive polymer layer and with the first surface of the third conductive polymer layer;

a first external electrode having an internal surface in electrical contact with the first surface of the first conductive polymer layer and an external surface;

a second external electrode having an internal surface in electrical contact with the second surface of the third conductive polymer layer and an external surface;

a conductive metal layer having first and second end portions respectively covering the first and second end surfaces of the device so as to be in direct physical contact with the first, second, and third conductive polymer layers and in electrical contact with the first and second internal electrodes, respectively, and top and bottom portions respectively covering the external surfaces of the first and second external electrodes;

a first terminal covering the first end portion, only a part of the top portion, and part of the bottom portion of the conductive metal layer so as to be in electrical contact with the first internal electrode and with the second external electrode through the conductive metal layer, the parts of the top and bottom portions of the metal layer covered by the first terminal being of equal area; and a second terminal covering the second end portion, only part of the bottom portion, and part of the top portion of the metal layer so as to be in electrical contact with the second internal electrode and the first external electrode through the conductive metal layer, the parts of the top and bottom portions of the conductive metal layer covered by the second terminal being of equal area.

2. The electronic device of claim 1, wherein the first and second internal electrode elements and the first and second external electrode elements are made of a metal foil.

3. The electronic device of claim 2, wherein the metal foil is made of a material selected from the group consisting of nickel and nickel-coated copper.

4. The electronic device of claim 1, wherein the first, second, and third conductive polymer layers are made of a material that exhibits PTC behavior.

5. The electronic device of claim 1, wherein the first and second terminals are formed by a solder layer applied over the conductive metal layer.

6. The electronic device of claims 1, 2, 3, 4, or 5, further comprising:

an insulative layer on each of the top and bottom portions of the conductive metal layer and located so as to insulate the first and second terminals from each other.

7. The electronic device of claim 6, wherein the first and second terminals and the top and bottom portions of the conductive metal layer define substantially flush top and bottom surfaces of the device.

8. The electronic device of claims 1, 2, 3, 4, or 5, wherein the first, second, and third conductive polymer layers are connected in parallel between the first and second terminals by the first and second internal electrodes and the first and second external electrodes.

9. An electronic device having first and second opposed end surfaces, the device comprising:

first and second conductive polymer layers, each having first and second opposed surfaces;

a first electrode having an internal surface in electrical contact with the first surface of the first conductive polymer layer and an external surface;

a second electrode in contact with the second surface of the first conductive polymer layer and the first surface of the second conductive polymer layer;

a third electrode having an internal surface in electrical contact with the second surface of the second conductive polymer layer and an external surface;

a conductive metal layer having a first and second end portions respectively covering the first and second end surfaces of the device so as to be in direct physical contact with the first and second conductive polymer layers, and top and bottom portions respectively covering the external surfaces of the first and third electrodes;

a first terminal covering the first end portion, only part of the top portion, and part of the bottom portion of the conductive metal layer so as to be in electrical contact with the third electrode through the conductive metal layer, the parts of the top and bottom portions of the metal layer covered by the first terminal being of equal area; and a second terminal covering the second end portion, only part of the bottom portion, and part of the top portion of the metal layer so as to be in electrical contact with the first electrode through the conductive metal layer, the parts of the top and bottom portions of the metal layer covered by the second terminal being of equal area.

10. The electronic device of claim 9, wherein the first, second, and third electrodes are made of a metal foil.

11. The electronic device of claim 10, wherein the metal foil is made of a material selected from the group consisting of nickel and nickel-coated copper.

12. The electronic device of claim 9, wherein the conductive polymer layer is made of a material that exhibits PTC behavior.

13. The electronic device of claim 9, wherein the first and second terminals are formed by a solder layer applied over the conductive metal layer.

14. The electronic device of claims 9, 10, 11, 12, or 13 further comprising:

an insulative layer on each of the top and bottom portions of the conductive metal layer and located so as to insulate the first and second terminals from each other.

15. The electronic device of claim 14, wherein the first and second terminals and the top and bottom portions of the conductive metal layer define substantially flush top and bottom surfaces of the device.

* * * * *